US012757445B2

(12) United States Patent
Frougier et al.

(10) Patent No.: US 12,757,445 B2
(45) Date of Patent: Oct. 6, 2026

(54) CO-INTEGRATION OF S/D METAL CONTACT CUT AND WRAP-AROUND-CONTACT

(71) Applicant: International Business Machines Corporation, Armonk, NY (US)

(72) Inventors: Julien Frougier, Albany, NY (US); Oleg Gluschenkov, Tannersville, NY (US); Oscar van der Straten, Guilderland Center, NY (US); Ruilong Xie, Niskayuna, NY (US); Juntao Li, Cohoes, NY (US); Min Gyu Sung, Latham, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 18/379,353

(22) Filed: Oct. 12, 2023

(65) Prior Publication Data

US 2025/0126838 A1 Apr. 17, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 30/62*** | (2025.01) |
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |

(52) U.S. Cl.

CPC ....... *H10D 30/6735* (2025.01); *H10D 30/014* (2025.01); *H10D 30/024* (2025.01); *H10D 30/43* (2025.01); *H10D 30/62* (2025.01); *H10D 30/6757* (2025.01); *H10D 62/121* (2025.01); *H10D 62/151* (2025.01); *H10D 64/017* (2025.01); *H10D 84/0128* (2025.01); *H10D 84/013* (2025.01); *H10D 84/0149* (2025.01); *H10D 84/0158* (2025.01); *H10D 84/038* (2025.01); *H10D 84/853* (2025.01)

(58) Field of Classification Search

CPC ............. H10D 30/6735; H10D 30/014; H10D 30/024; H10D 30/43; H10D 30/62; H10D 30/6757; H10D 62/121; H10D 62/151; H10D 64/017; H10D 84/0128; H10D 84/013; H10D 84/0149; H10D 84/0158; H10D 84/038; H10D 84/853; H10D 84/0186; H10D 84/83

See application file for complete search history.

(56) References Cited

U.S. PATENT DOCUMENTS

| | | | |
|---|---|---|---|
| 10,276,442 | B1 | 4/2019 | Xie et al. |
| 10,522,410 | B2 | 12/2019 | Economikos et al. |
| 10,559,656 | B2 | 2/2020 | Bourjot et al. |
| 10,804,398 | B2 | 10/2020 | Frougier et al. |

(Continued)

*Primary Examiner* — Sitaramarao S Yechuri

(74) *Attorney, Agent, or Firm* — Scully, Scott, Murphy & Presser, P.C.; Kimberly Zillig

(57) ABSTRACT

A method to co-integrate a metal trench cut for aggressively scaled contact tip-to-tip and wrap-around-contact formation is provided. A semiconductor device made from the method is also provided in which a metal trench cut region and wrap-around-contacts are present.

20 Claims, 5 Drawing Sheets

(56) References Cited

U.S. PATENT DOCUMENTS

| | | | | |
|---|---|---|---|---|
| 10,832,954 | B2 | 11/2020 | Frougier et al. | |
| 10,840,345 | B2 | 11/2020 | Greene et al. | |
| 10,896,845 | B2 | 1/2021 | Cheng et al. | |
| 11,195,746 | B2 | 12/2021 | Xie et al. | |
| 11,398,480 | B2 | 7/2022 | Zhang et al. | |
| 11,424,367 | B2 | 8/2022 | Miller et al. | |
| 11,521,894 | B2 | 12/2022 | Xie et al. | |
| 11,569,361 | B2 | 1/2023 | Frougier et al. | |
| 2018/0182757 | A1* | 6/2018 | Xie | H10D 64/518 |
| 2018/0337176 | A1* | 11/2018 | Lee | H10D 30/024 |
| 2020/0119180 | A1* | 4/2020 | Frougier | H10D 30/62 |
| 2020/0152751 | A1 | 5/2020 | Greene et al. | |
| 2021/0313424 | A1* | 10/2021 | Chiu | H10D 62/151 |
| 2023/0099985 | A1 | 3/2023 | Xie et al. | |
| 2024/0112916 | A1* | 4/2024 | Ghosh | H10D 84/832 |
| 2024/0321892 | A1* | 9/2024 | Guler | H10D 30/014 |

* cited by examiner

CO-INTEGRATION OF S/D METAL CONTACT CUT AND WRAP-AROUND-CONTACT

BACKGROUND

The present application relates to semiconductor technology, and more particularly to a semiconductor device including a source/drain metal contact cut and a wrap-around-contact.

With shrinking dimensions of various integrated circuit components, transistors such as field effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field effect transistors (MOSFETs) are well suited for use in high-density integrated circuits. As the size of MOSFETs and other devices decreases, the dimensions of source/drain regions, channel regions, and gate electrodes of the devices, also decrease.

FinFETs and nanosheet FETs are types of FETs that can be used in tight pitch applications. Nanosheet FETs include multiple semiconductor channel material nanosheets, each nanosheet being separated by a gate stack including a layer of electrically conductive gate material and a gate dielectric material. The gate stacks wrap around all sides of the nanosheets, thereby forming a gate-all-around (GAA) structure. Epitaxial regions on the ends of the nanosheets form source/drain regions of the nanosheet FETs. Spacers are employed for electrically isolating the gates from the source/drain regions of nanosheet transistors.

The contribution of middle-of-line (MOL) contact resistance to total parasitic resistance is increasing due to aggressive dimensional scaling in advanced complementary metal oxide semiconductor (CMOS) devices. Silicide/source-drain interface resistance can be a major contributor to the total external parasitic resistance. Increasing silicide contact length by wrapping around the total source-drain surface can reduce the overall contact resistance. Trench silicide liner coverage of a source-drain epitaxy as a wrap-around contact to reduce spreading resistance may be important for designing advanced semiconductor devices.

SUMMARY

A method to co-integrate a metal trench cut for aggressively scaled contact tip-to-tip and wrap-around-contact formation is provided. A semiconductor device made from the method is also provided in which a metal trench cut region and wrap-around-contacts are present.

In one aspect of the present application, a semiconductor device is provided. In one embodiment of the present application, the semiconductor device includes a dielectric pillar located in contact cut region that is positioned between a first source/drain region of a first transistor and a second source/drain region of a second transistor. A first source/drain (S/D) contact structure is located on a first side of the dielectric pillar and is electrically connected to the first source/drain region. A second S/D contact structure is located on a second side of the dielectric pillar and is electrically connected to the second source/drain region. A first metal semiconductor alloy liner is present that continuously wraps around the first source/drain region, and a second metal semiconductor alloy liner is also present that continuously wraps around the second source/drain region. The semiconductor device further includes a metal conductive liner located on the first side of the dielectric pillar and on the second side of the dielectric pillar. The metal conductive liner that is located on the first side of the dielectric pillar forms an interface with the first S/D contact structure and the first metal semiconductor alloy liner, and the metal conductive liner that is located on the second side of the dielectric pillar forms an interface with the second S/D contact structure and the second metal semiconductor alloy liner.

In another aspect of the present application, a method of forming a semiconductor structure is provided. In one embodiment, the method includes forming a semiconductor structure including a first source/drain region of a first transistor located in a first active area, a second source/drain region of a second transistor located in a second active area and a MOL dielectric layer located above and adjacent to the first source/drain region and the second source/drain region. A source/drain (S/D) trench metal contact structure is then formed which includes a metal semiconductor alloy layer located on each of the first source/drain region and the second source/drain region and a shared contact conductor metal. The S/D trench metal contact structure is then cut to form a contact cut region, wherein the cutting removes the metal semiconductor alloy layer from both the first source/drain region and the second source/drain region in the contact cut region and cuts the shared contact conductive metal into individual S/D contact structures. Additional metal semiconductor alloy layer is thereafter formed on physically exposed surfaces of the first source/drain region and the second source/drain region in the contact cut region. Next, a conductive material liner is selectively deposited in the contact cut region, and thereafter a remaining volume of the contact cut region is filled with a contact cut dielectric material.

DETAILED DESCRIPTION

Figure 1:
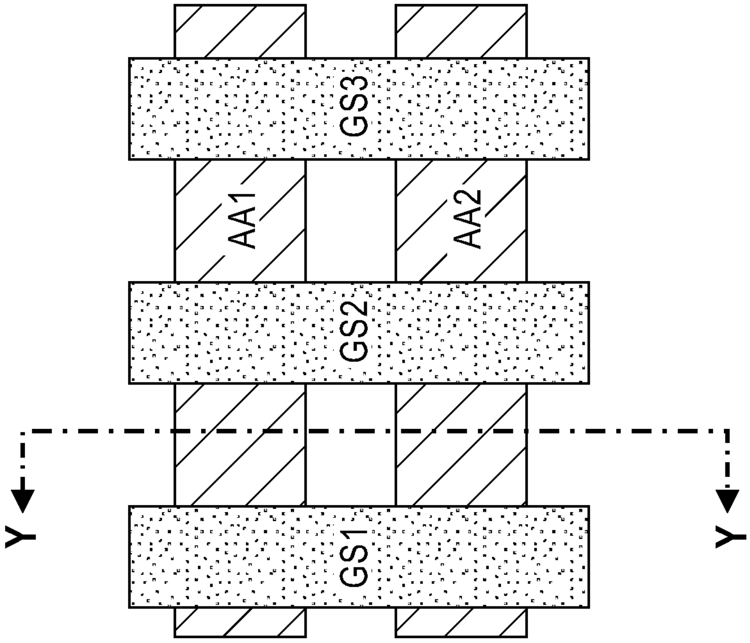
FIG. 1 is a top-down view of an exemplary semiconductor device layout that can be employed in accordance with an embodiment of the present application, the semiconductor device layout includes a plurality of active areas oriented along a first direction, and a plurality of functional gate structures that are oriented in a second direction which is perpendicular to the first direction; in the drawing cut Y-Y is shown.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Advanced sub-48 nm CPP nanosheet device nodes will require two critical elements to meet scaling requirements which are as follows: (I) Very aggressive contact tip-to-tip requirement (less than 20 nm) which is unattainable with current extreme UV patterning, and (2) Potential needs for wrap-around-contact to meet contact resistance targets. The present application provides a method and semiconductor device to co-integrate the metal trench cut for aggressively scaled contact tip-to-tip and wrap-around-contact.

Figure 8:
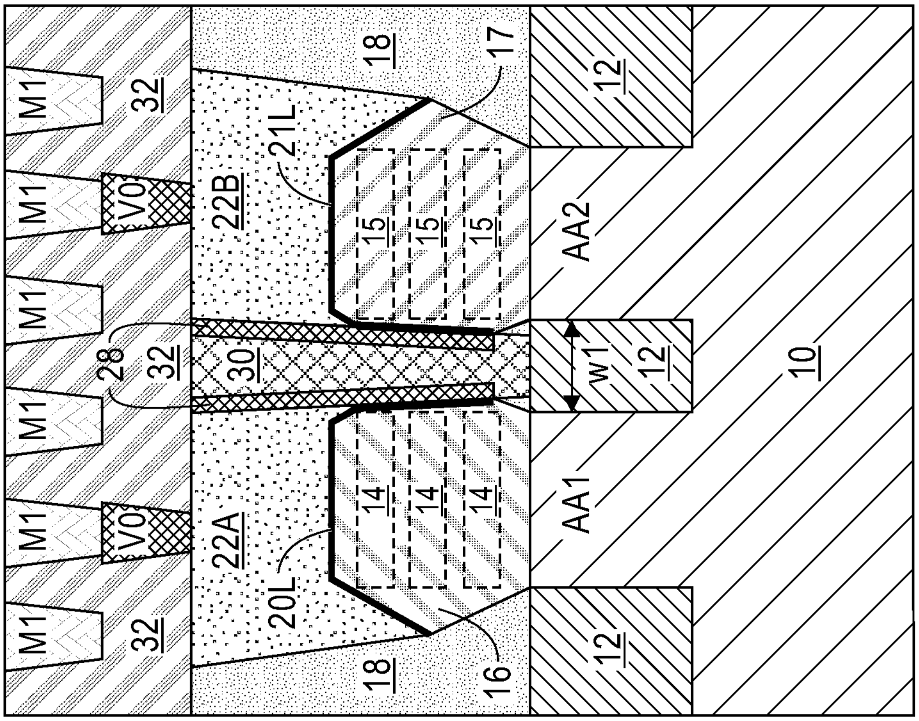
FIG. 8 is a cross sectional view of the exemplary semiconductor structure shown in FIG. 7 after forming metal vias and metal lines to provide an exemplary semiconductor device in accordance with an embodiment of the present application.
Figure 9:
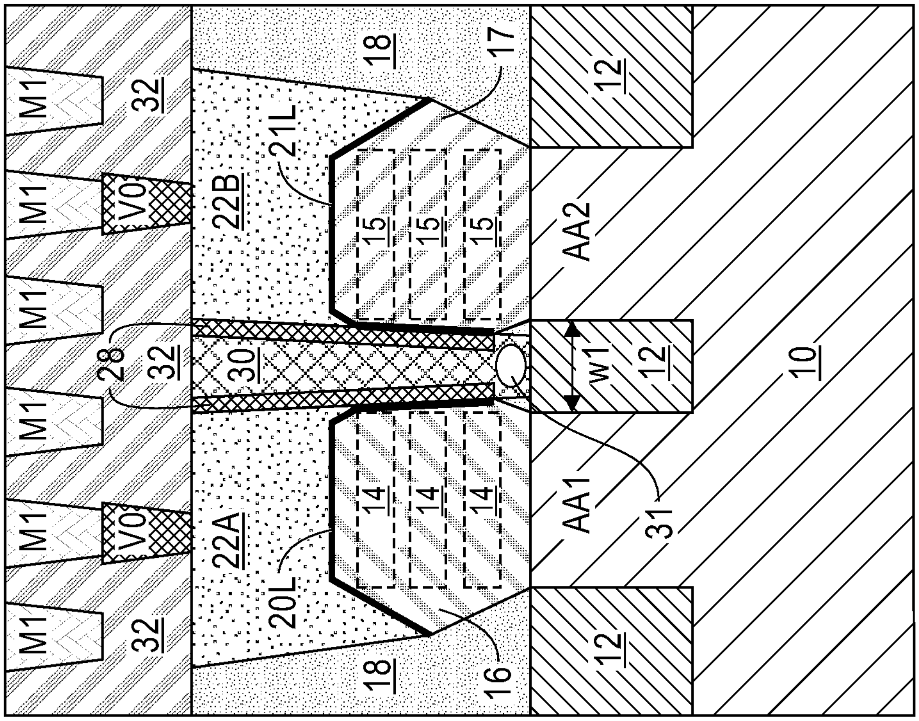
FIG. 9 is a cross sectional view of another exemplary semiconductor device in accordance with the present application.
Figure 10:
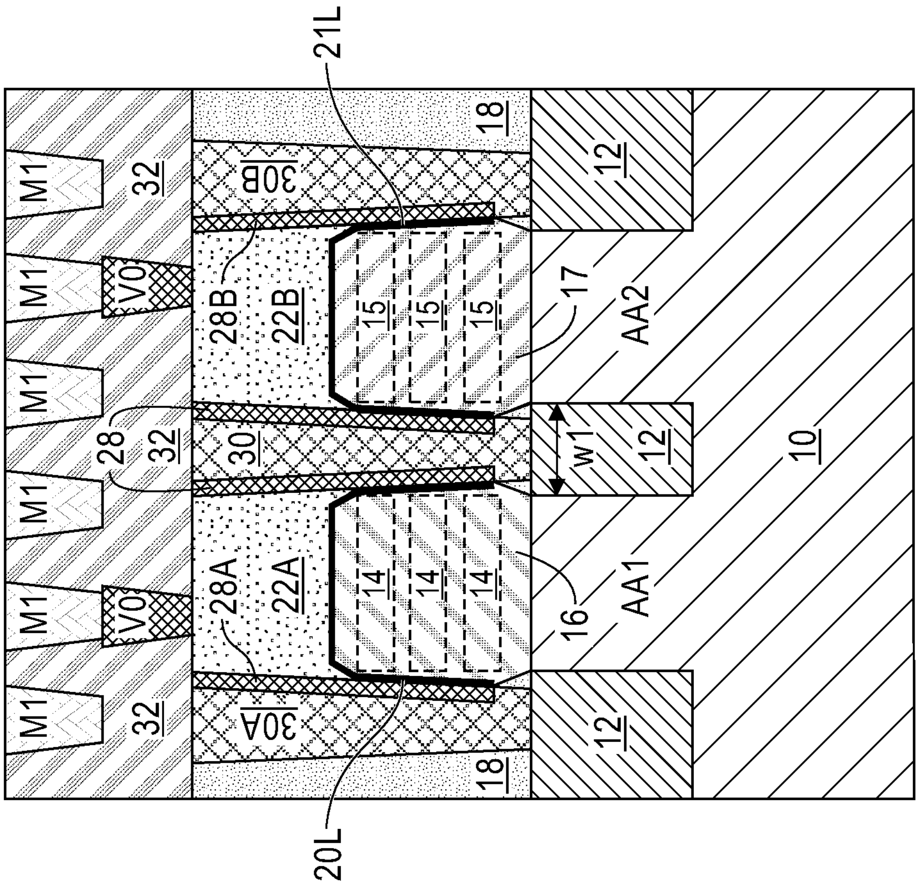
FIG. 10 is a cross sectional view of yet other exemplary semiconductor device in accordance with the present application.

Notably and as shown in FIGS. 8, 9 and 10, a semiconductor device is provided that meets the two requirements mentioned above. As illustrated in FIGS. 8, 9 and 10, the semiconductor device includes dielectric pillar 30 located in contact cut region 26 that is positioned between a first source/drain region 16 of a first transistor and a second source/drain region 17 of a second transistor. In the present application, the term "first source/drain region" is used to designate that the source/drain region is associated with the first transistor, while the term "second source/drain region" is used to designate that the source/drain region is associated with the second transistor. First S/D contact structure 22A is located on a first side of the dielectric pillar 30 and is electrically connected to the first source/drain region 16. Second S/D contact structure 22B is located on a second side of the dielectric pillar 30 and is electrically connected to the second source/drain region 17. First metal semiconductor alloy liner 20L is present that continuously wraps around the first source/drain region 16, and second metal semiconductor alloy liner 21L is also present that continuously wraps around the second source/drain region 17. The semiconductor device further includes metal conductive liner 28 located on the first side of the dielectric pillar 30 and on the second side of the dielectric pillar 30. The metal conductive liner 28 that is located on the first side of the dielectric pillar 30 forms an interface with the first S/D contact structure 22A and the first metal semiconductor alloy liner 20L, and the metal conductive liner 28 that is located on the second side of the dielectric pillar 30 forms an interface with the second S/D contact structure 22B and the second metal semiconductor alloy liner 21L. The semiconductor device of the present application co-integrates a source/drain metal contact cut and a wrap-around-contact. A more robust semiconductor device is thus provided.

In some embodiments of the present application (see, for example, FIGS. 7-8), the first metal semiconductor alloy liner 20L and the second metal semiconductor alloy liner 21L are both asymmetric liners having a length in the contact cut region 26 that is larger than a length that is present on a side of the first source/drain region 16 and the second source/drain region 17 that is opposite the contact cut region 26.

In such embodiments, in which asymmetric metal semiconductor alloy liners are employed, the first source/drain region 16 and the second source/drain region 17 are both asymmetrically shaped source/drain regions having a tip located on a side opposite the contact cut region 26 and a sidewall in the contact cut region 26 that is substantially perpendicular to a horizontal surface of semiconductor substrate 10 that is located beneath the first transistor and the second transistor. The asymmetrically shaped source/drain regions eliminate source/drain tip to tip shorting.

In some embodiments of the present application (see, for example, FIG. 10), the first metal semiconductor alloy liner 20L and the second metal semiconductor alloy liner 21L are both symmetric liners.

In such embodiments, in which symmetric metal semiconductor alloy liners are employed, the first source/drain region 16 and the second source/drain region 17 are both symmetrically shaped source/drain regions having no tips on either side of the first source/drain region 16 and the second source/drain region 17.

In some embodiments of the present application, and as is further illustrated in FIG. 10, the semiconductor device can further include an additional metal conductive liner (metal conductive liners 28A and 28B shown in FIG. 10) and an additional dielectric pillar (i.e. dielectric pillars 30A and 30B illustrated I FIG. 10) located on a side of the first source/drain region 16 and the second source/drain region 17 that is opposite the contact cut region 26.

In some embodiments, and as is illustrated in FIG. 9), the semiconductor device can further include void 31 at a bottom of the dielectric pillar 30 that is located between in the contact cut region 26.

In some embodiments of the present application and is illustrated in each of FIGS. 8, 9 and 10, the semiconductor device can further include a first metal line electrically connected to the first S/D contact structure 22A by a first metal via, and a second metal line electrically connected to the second S/D contact structure 22B by a second metal via. The metal vias are labeled as V0 in FIGS. 8, 9 and 10, and the metal lines are labeled as M1 in FIGS. 8, 9, and 10. The metal lines and metal vias are used to electrically connect the source/drain region of the first and second transistors to a back-end-of-the-line (BEOL) structure that can be subsequently formed.

In some embodiments of the present application, dielectric pillar 30 extends down to shallow trench isolation structure 12 that separates a first active area, AA1, containing the first transistor from a second active area, AA2, containing the second transistor. This structural configurate provides robust electrically isolation between the first transistor in AA1 and the second transistor in AA2.

In some embodiments of the present application, the dielectric pillar 30 has a topmost surface that is coplanar with a topmost surface of each of the first S/D contact structure 22A, the second S/D contact structure 22B and the metal conductive liner 28.

In some embodiments of the present application, the dielectric pillar 30 extends directly beneath a bottommost surface of each of the first metal semiconductor alloy liner 20L, the second metal semiconductor alloy liner 21L and the metal conductive liner 28.

In some embodiments, the first metal semiconductor alloy liner 20L and the second metal semiconductor alloy liner 21L are both composed of a metal silicide. In other embodiments, the first metal semiconductor alloy liner 20L and the second metal semiconductor alloy liner 21L are both composed of a metal germanide.

In some embodiments, the semiconductor device can further include MOL dielectric layer 18 adjacent to the first source/drain region 16 and the second source/drain region 17.

In some embodiments, the MOL dielectric layer 18 embeds the first metal semiconductor alloy liner 20L, the first S/D contact structure 22A, the second metal semiconductor alloy liner 21L and the second S/D contact structure 20B.

In some embodiments, the first transistor and the second transistor are both nanosheet FETs. In such embodiments, the first transistor includes a plurality of vertically stacked first semiconductor channel material nanosheets 14 and the second transistor includes a plurality of vertically stacked second semiconductor channel material nanosheets 15.

In some embodiments, the first transistor and the second transistor are both finFETs.

Figure 2:
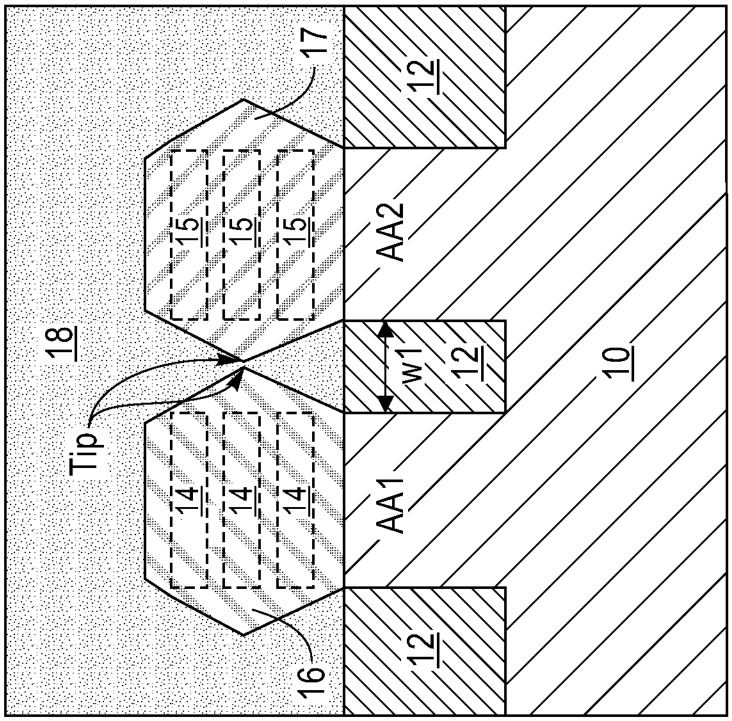
FIG. 2 is a cross sectional view of an exemplary semiconductor structure corresponding to cut Y-Y shown in FIG. 1 that can be employed in the present application, the semiconductor structure includes a first source/drain region of a first transistor located in a first active area, a second source/drain region of a second transistor located in a second active area and a MOL dielectric layer located above and adjacent to the first source/drain region and the second source/drain region.
Figure 4:
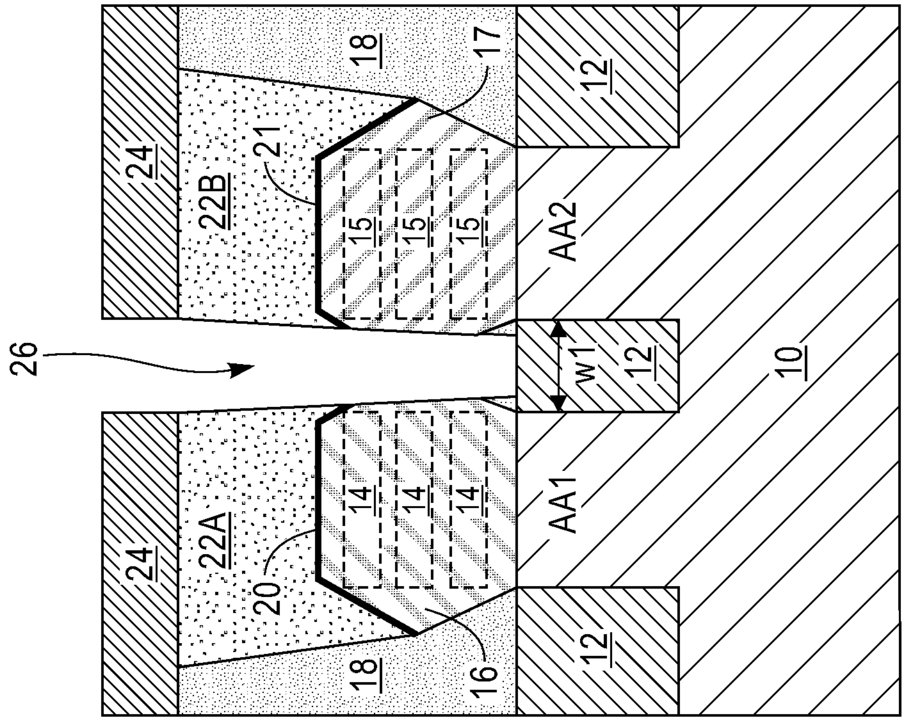
FIG. 4 is a cross sectional view of the exemplary semiconductor structure shown in FIG. 3 after cutting the S/D trench metal contact structure to form a contact cut region, wherein the cutting removes the metal semiconductor alloy layer from both the first source/drain region and the second source/drain region in the contact cut region.
Figure 3:
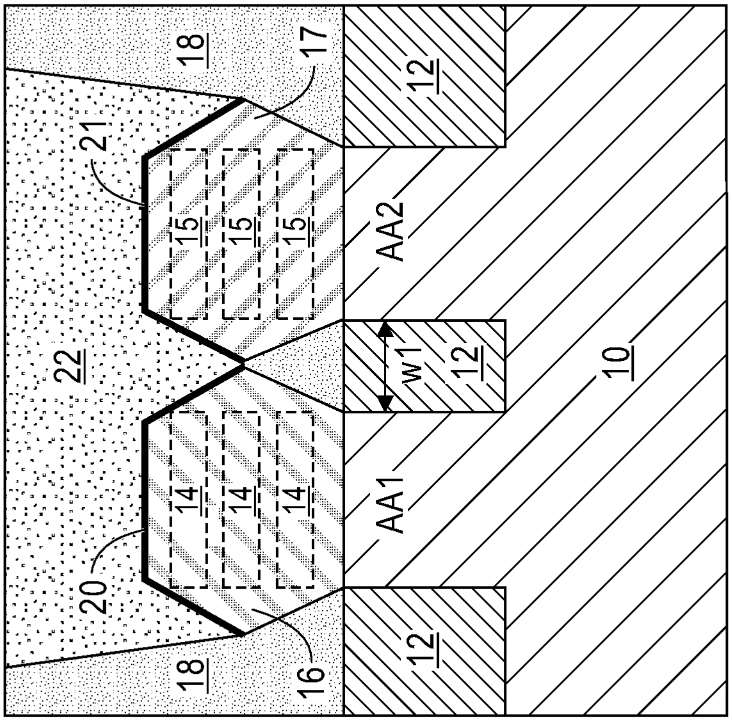
FIG. 3 is a cross sectional view of the exemplary semiconductor structure shown in FIG. 2 after forming a source/drain (S/D) trench metal contact structure including a metal semiconductor alloy layer located on each of the first source/drain region and the second source/drain region and a shared contact conductor metal.
Figure 6:
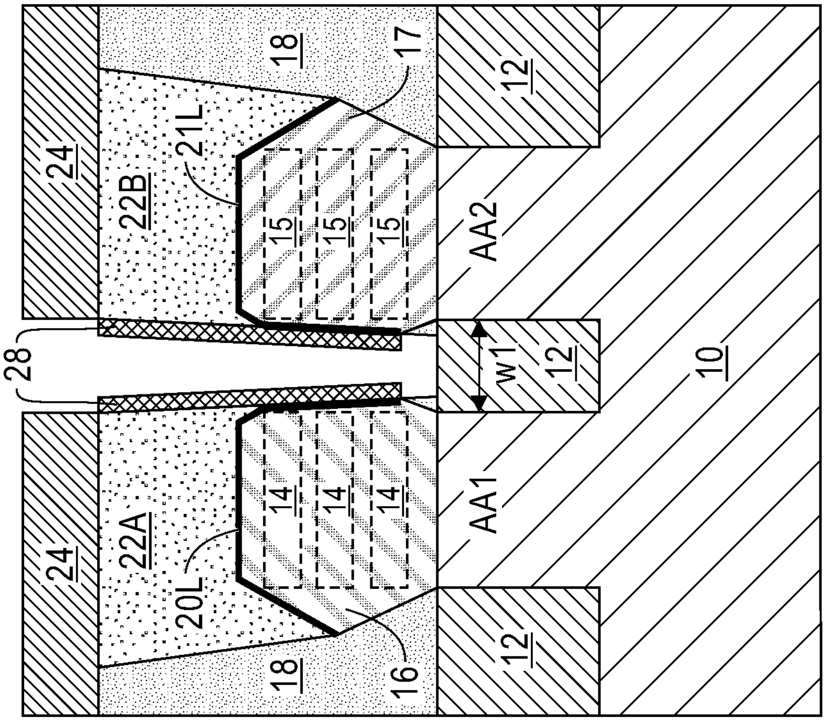
FIG. 6 is a cross sectional view of the exemplary semiconductor structure shown in FIG. 5 after selective deposition of a conductive material liner in the contact cut region.
Figure 5:
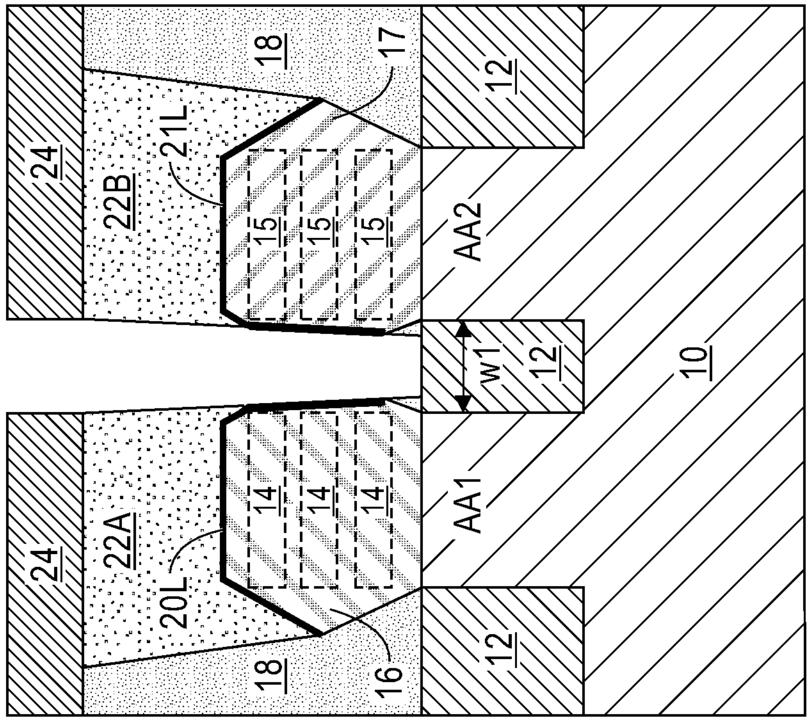
FIG. 5 is a cross sectional view of the exemplary semiconductor structure shown in FIG. 4 after additional metal semiconductor alloy layer formation on physically exposed surfaces of the first source/drain region and the second source/drain region in the contact cut region.
Figure 7:
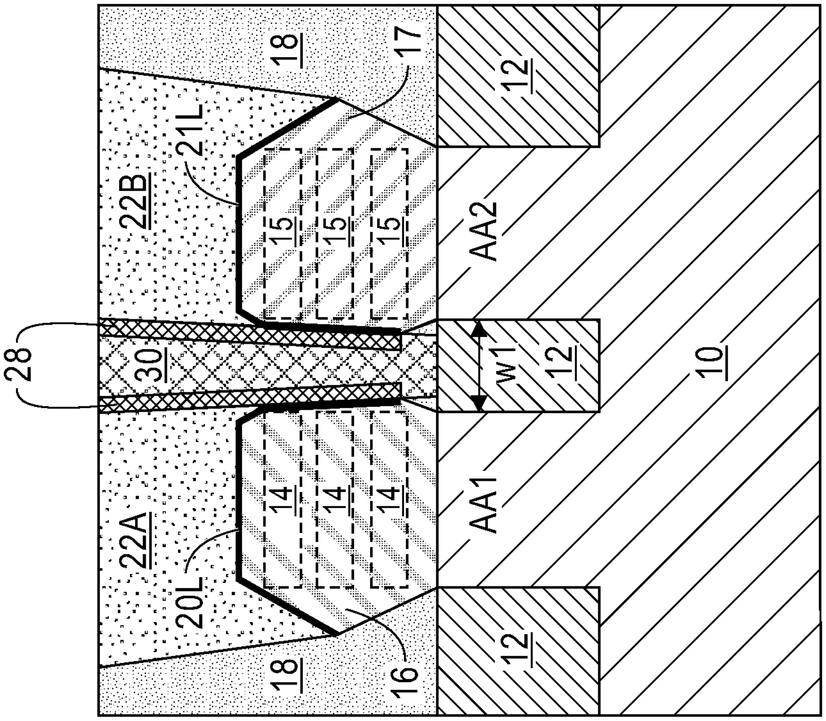
FIG. 7 is a cross sectional view of the exemplary semiconductor structure shown in FIG. 6 after filling a remaining volume of the contact cut region with a contact cut dielectric material.

The method the present application includes forming a semiconductor structure including first source/drain region 16 of a first transistor located in a first active area, second source/drain region 17 of a second transistor located in a second active area and MOL dielectric layer 18 located above and adjacent to the first source/drain region 16 and the second source/drain region 16. The step is illustrated in FIG. 2 of the present application. A source/drain (S/D) trench metal contact structure is then formed which includes a metal semiconductor alloy layer (i.e., first metal semiconductor alloy layer 20 and second metal semiconductor alloy layer 21) located on each of the first source/drain region 16 and the second source/drain region 17 and shared contact conductor metal 22. The step is illustrated in FIG. 3 of the present application. Next, and as illustrated in FIG. 4, the S/D trench metal contact structure is cut to form contact cut region 26, wherein the cutting removes the metal semiconductor alloy layer (i.e., first metal semiconductor alloy layer 20 and second metal semiconductor alloy layer 21) from both the first source/drain region 16 and the second source/drain region 17 in the contact cut region 26 and cuts the shared contact conductive metal 22 into individual S/D contact structures (i.e., first S/D contact structure 22A and second S/D contact structure 22B). Additional metal semiconductor alloy layer is thereafter formed on physically exposed surfaces of the first source/drain region 16 and the second source/drain region 17 in the contact cut region 26. This additional metal semiconductor alloy layer formation forms first metal semiconductor alloy liner 20L on the first source/drain region and a second metal semiconductor alloy liner 21L on the second source/drain region as is illustrated in FIG. 5. Next, and as is shown in FIG. 6, conductive material liner 28 is selectively deposited in the contact cut region 26, and thereafter and as is shown in FIG. 7, a remaining volume of the contact cut region 26 is filled with a contact cut dielectric material. This filling steps forms dielectric pillar 30 as is illustrated in FIG. 7. FIG. 8 shows a further step in which metal vias V0 and metal lines M1 are formed above the MOL dielectric layer 18. The method of the present application co-integrations a S/D metal cut and a wrap-around contact formation. The method of the present application co-integrates a source/drain metal contact cut and a wrap-around-contact. A more robust semiconductor device is thus provided by the method of the present application. These and other aspects of the present application will now be described in greater detail.

Referring now to FIG. 1, there is illustrated an exemplary semiconductor device layout that can be employed in accordance with an embodiment of the present application. The exemplified semiconductor device layout includes a plurality of active areas, AA1 and AA2, oriented along a first direction, and a plurality of functional gate structures, e.g., GS1, GS2 and GS3, that are oriented in a second direction which is perpendicular to the first direction; in the drawing cut Y-Y is shown. Cut Y-Y is through a source/drain area that is located between GS1 and GS2 and through two active areas, AA1 and AA2. In the present application, AA1 is an area in which a first transistor is formed, while AA2 is an area in which a second transistor is formed.

In the present application, the first transistor and the second transistor are non-planar FETs such as, for example, FinFETs or nanosheet FETS. In the present application, a nanosheet transistor is a transistor that includes at least one, preferably a plurality of, semiconductor channel material nanosheet(s) in which a gate structure (including a gate dielectric layer and a gate electrode) is formed wrapping around each semiconductor channel material nanosheet. The nanosheet transistor will include a source/drain region located on each side of the gate structure. The source/drain regions extend outward from a sidewall of each of the semiconductor channel material nanosheets. In the present application, a finFET includes a semiconductor fin extending upward from a surface of a substrate. The semiconductor fin forms a semiconductor channel region in which a gate structure can be formed along the sidewalls and on top of the semiconductor fin. The finFET transistor will include a source/drain region located on each side of the gate structure.

In both embodiments, the source/drain regions are formed utilizing an epitaxial growth process. Throughout the present application, the terms "epitaxial growth" or "epitaxially growing" mean the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. In both the finFET and nanosheet FET embodiments, the source/drain regions can be referred to as epi source/drain regions since they are formed by epitaxial growth as defined above.

Referring now to FIG. 2, there is illustrated an exemplary semiconductor structure that can be employed in the present application. The illustrated semiconductor structure shown in FIG. 2 includes a first source/drain region 16 of a first transistor located in a first active area, AA1, a second source/drain region 17 of a second transistor located in a second active area, AA2, and a MOL dielectric layer 18 located above and adjacent to the first source/drain region 16 and the second source/drain region 17. In FIG. 1, AA1 and AA2 are spaced apart by width, w1. When w1 between AA1 and AA2 scales, the risk of direct shorts between the first source/drain region 16 and the second source/drain region 17 increases.

In FIG. 2, the illustrated first source/drain region 16 represents one of the source/drain regions of the first transistor, while the second source/drain region represents one of the source/drain regions of the second transistor. The other source/drain region of the first transistor is in the plane of the drawing sheet including FIG. 2 and behind the first semiconductor channel material nanosheets 14, and the other source/drain region of the second transistor is located in the plane of the drawing sheet including FIG. 2 and behind the second semiconductor channel material nanosheets 15. The first semiconductor channel material nanosheets 14 and the second semiconductor channel nanosheets 15 are illustrated as dotted lines to represent that the first semiconductor channel material nanosheets 14 are located behind the first source/drain region 16 and that the second semiconductor channel material nanosheets 15 are located behind the second source/drain region 17. In embodiments, the first semiconductor channel material nanosheets 14 can be replaced by a first semiconductor fin, and the second semiconductor channel material nanosheets 15 can be replaced by a second semiconductor fin. The exemplary semiconductor structure shown in FIG. 1 includes semiconductor substrate 10 and shallow trench isolation structures 12.

In the present application, the first transistor is of a first conductivity type, while the second transistor is of a second conductivity type that is opposite in terms of conductivity than the first conductivity type. In one embodiment, the first transistor is an n-type FET, while the second transistor is a p-type FET. In another embodiment, the first transistor is a p-type FET, while the second transistor is an n-type FET. It is noted that the gate structure including the gate dielectric layer and the gate electrode of each of the first and second transistors are not shown in the cross-sectional view Y-Y illustrated in FIG. 2 and in the remaining drawings of the present application.

The semiconductor substrate 10 is composed of a first semiconductor material. The term "semiconductor material" is used throughout the present application to denote a material having semiconducting properties. Examples of semiconductor materials that can be used in the present application in providing the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In one example, the semiconductor substrate 10 is composed of Si.

Shallow trench isolation structure 12 can be formed on a physically exposed sub-surface of the semiconductor substrate 10 and surrounds each of AA1 and AA2. The shallow trench isolation structure 12 is composed of any trench dielectric material such as, for example, silicon oxide. In some embodiments, a trench dielectric liner composed of, for example, SiN, can be present along a sidewall and a bottom wall of the trench dielectric material. The shallow trench isolation structure 12 can have a topmost surface that is coplanar with, or slightly above or below, a topmost surface of the semiconductor substrate 10. The shallow trench isolation structure 12 can be formed by depositing the optional trench dielectric liner material and the trench dielectric material in a trench formed into the semiconductor substrate 10, and thereafter performing an etch back process.

Each first semiconductor channel material nanosheet 14 (or semiconductor fin) is composed of a second semiconductor material, while each second semiconductor channel material nanosheet 15 (or second semiconductor fin) is composed of a third semiconductor material. The second semiconductor material can be compositionally the same as, or compositionally different from, the third semiconductor material. The second semiconductor material and/or the third semiconductor material can be compositionally the same as, or compositionally different from, the first semiconductor material that provides the semiconductor substrate 10. In one embodiment, the second semiconductor material that provides each first semiconductor channel material nanosheet 14 (or first semiconductor fin) can provide high channel mobility for n-type FET devices, while the third semiconductor material that provides each second semiconductor channel material nanosheet 15 (or second semiconductor fin) can provide high channel mobility for p-type FET devices. In another embodiment, the second semiconductor material that provides each first semiconductor channel material nanosheet 14 (or first semiconductor fin) can provide high channel mobility for p-type FET devices, while the third semiconductor material that provides each second semiconductor channel material nanosheet 15 (or second semiconductor fin) can provide high channel mobility for n-type FET devices.

The first source/drain region 16 is an epitaxial source/drain region that is composed of a fourth semiconductor material and a first dopant, while the second source/drain region 17 is also an epitaxial source/drain region that is composed of a fifth semiconductor material and a second dopant, which is of a different conductivity type than the first dopant. As used herein, a "source/drain" region can be a source region or a drain region depending on subsequent wiring and application of voltages during operation of the transistor. The fourth semiconductor material that provides the first source/drain region 16 can be compositionally the same as, or compositionally different from, the fifth semiconductor material that provides the second source/drain region 17. The fourth semiconductor material that provides the first source/drain region 16 can be compositionally the same as, or compositionally different from, the second semiconductor material that provides each first semiconductor channel material nanosheet 14 (or first semiconductor fin). The fifth semiconductor material that provides the second source/drain region 17 can be compositionally the same as, or compositionally different from, the third semiconductor material that provides each second semiconductor channel material nanosheet 15 (or second semiconductor fin).

In one embodiment, the first dopant that is present in the first source/drain region 16 can be a p-type dopant, while the second dopant that is present in the second source/drain region 17 can be an n-type dopant. In another embodiment, the first dopant that is present in the first source/drain region 16 can be n-type dopant, while the second dopant the is present in the second source/drain region 17 can be a p-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, both the first source/drain region 16 and the second source/drain region 17 can have a dopant concentration of from $4\times10^{20}$ atoms/cm$^3$ to $3\times10^{2'}$ atoms/cm$^3$.

As is shown in FIG. 2, the first source/drain region 16 and the second source/drain region 17 include tips which face each other, and tips (not specifically labeled) that are non-facing each other. The facing tips are located between AA1 and AA2.

The MOL dielectric layer 18 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, as defined above, or any combination thereof. The MOL dielectric layer 18 can be formed by a deposition process including, but not limited to, CVD, PECVD or spin-on coating. A planarization process such as, for example, chemical mechanical polishing (CMP) typically follows the deposition process.

As mentioned above, the gate structure within each of AA1 and AA2 includes a gate dielectric layer and a gate electrode material. The gate dielectric layer of each gate structure is composed of a gate dielectric material that typically has a dielectric constant of greater than 4.0. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SfTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg).

The gate electrode of each gate structure is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co).

The semiconductor structure shown in FIG. 2 can be formed utilizing any conventional nanosheet FET fabrication process or finFET fabrication process that is well known to those skilled in the art. So not to obscure any aspect of the present application, details regarding the nanosheet FET fabrication process or the finFET fabrication process used in providing the exemplary semiconductor structure shown in FIG. 2 are not provided herein.

Referring now to FIG. 3, there is illustrated the exemplary semiconductor structure shown in FIG. 2 after forming a S/D trench metal contact structure including a metal semiconductor alloy layer located on each of the first source/drain region 16 and the second source/drain region 17 and a shared contact conductor metal 22. A source/drain (S/D) trench metal contact structure would be formed on each side of the gate structure.

Notably, a first metal semiconductor alloy layer 20 is formed on the first source/drain region 16 and a second metal semiconductor alloy layer 21 is formed on the second source/drain region 17. Throughout the present application, the term "metal semiconductor alloy" denotes an alloy that is composed of a semiconductor material and a metal semiconductor alloy forming metal. Throughout the present application, the term "metal semiconductor alloy forming metal" denotes any electropositive metal that reacts with a semiconductor material to form a metal semiconductor alloy. Illustrative examples of metal semiconductor alloy forming metals include, but are not limited to, titanium (Ti), nickel (Ni), cobalt (Co), platinum (Pt), or combinations thereof such as for example, Ni and Pt. In the present application, the first metal semiconductor alloy layer 20 is a first alloy that is composed of the fourth semiconductor material and a metal semiconductor alloy forming metal and the second metal semiconductor alloy layer 21 is a second alloy that is composed of the fifth semiconductor material and a same metal semiconductor alloy forming metal as used in providing the first metal semiconductor alloy layer 20. Typically, the first metal semiconductor alloy layer 20 and the second metal alloy layer 21 are metal silicides such as, for example, TiSi, NiSi, CoSi, or NiPtSi. In addition to metal silicides, the first metal semiconductor alloy layer 20 and the second metal alloy layer 21 be a metal germanide.

In the present, the first metal semiconductor alloy layer 20 is a continuous layer that is formed on a physically exposed surface of the first source/drain region 16 that extends from one tip of the first source/drain region 16 to the second tip of the first source/drain region 16. In the present, the second metal semiconductor alloy layer 21 is a continuous layer that is formed on a physically exposed surface of the second source/drain region 17 that extends from one tip of the second source/drain region 17 to the second tip of the second source/drain region 17. Typically, the first metal semiconductor alloy layer 20 is spaced apart from the second metal semiconductor alloy layer 21 and no direct contact between the first metal semiconductor alloy layer 20 and the second metal semiconductor alloy layer 21 exists.

The shared contact conductor metal 22, which is formed on top of the first metal semiconductor alloy layer 20 and the second metal semiconductor alloy layer 21, can be composed of any conductive metals such as, for example, W, Cu, Al, Co, Ru, Mo, Os, Ir, Rh, or an alloy thereof (e.g., W—Cu alloy or a Al—Cu alloy).

The source/drain (S/D) trench metal contact structure can be formed by first forming a trench in the MOL dielectric layer 18 that physically exposes both the first source/drain region 16 and the second source/drain region 17. The trench can be formed by lithography and etching. Lithography includes forming a photoresist material on a material or stack of materials that needs to be patterned, exposing the photoresist material to a desired pattern of irradiation and then developed the exposed photoresist material. Etching can include a dry etching process such as, for example, reactive ion etching (RIE), ion beam etching (IBE) or plasma etching. In some embodiments, the etch can include a chemical wet etch process in which a chemical etchant is used. The trench extends from an outward facing tip of the first source/drain region 16 to the outward facing tip of the second source/drain region 17. Next, a metal semiconductor alloy forming metal is formed within the trench and on the physically exposed surface of both the first source/drain region 16 and the second source/drain region 17. The metal semiconductor alloy forming metal can be formed by chemical vapor deposition (CVD), plasma enhanced chemical vapor deposition (PECVD), physical vapor deposition (PVD), atomic layer deposition (ALD), sputtering or plating. In some embodiments, a diffusion barrier layer (not shown) such as, for example, TaN and/or TiN can then by formed on the metal semiconductor alloy forming metal. In other embodiments, the diffusion barrier layer formation can be omitted. When present, the diffusion barrier layer is formed by a deposition process such as, for example, CVD, PECVD, PVD, or ALD. A metal semiconductor alloy forming anneal such as, for example, a metal silicide forming anneal, is then performed. The metal semiconductor alloy forming anneal is performed at a temperature of typically 550° C. or greater that facilitates a reaction between the metal semiconductor alloy forming metal and an upper semiconductor portion of both the first source/drain region 16 and the second source/drain region 17. This metal semiconductor alloy forming anneal forms the first metal semiconductor alloy layer 20 and the second semiconductor alloy layer 21 mentioned above. After the anneal, the diffusion barrier layer (if the same is present) and any non-reactive metal semiconductor forming metal can be removed utilizing one or more material removal processes (i.e., etching) that is/are selective in removing the diffusion barrier layer (if the same is present) and any non-reactive metal semiconductor forming metal.

Next, the shared contact conductor metal 22 is formed in the trench and on top of the first metal semiconductor alloy 20 and the second metal semiconductor alloy 21 by a deposition of at least one of the above-mentioned conductive metals, followed by a planarization process. The deposition of at least one of the above-mentioned conductive metals includes, CVD, PECVD, PVD, ALD, sputtering or plating. The planarization process includes CMP and/or grinding. After planarization, the shared contact conductor metal 22 has a topmost surface that is typically coplanar with a topmost surface of the MOL dielectric layer 18.

Referring now to FIG. 4, there is illustrated the exemplary semiconductor structure shown in FIG. 3 after cutting the S/D trench metal contact structure to form a contact cut region 26, wherein the cutting removes the metal semiconductor alloy layer from both the first source/drain region 16 and the second source/drain region 17 in the contact cut region 26. Notably, this step removes a portion of the first metal semiconductor alloy layer 20 from the first source/drain region 16 and a portion of the second metal semiconductor alloy layer 21 from the second source/drain region 17 in the contact cut region 26. In the present application, the contact cut region 26 extends entirely through the shared contact conductor metal 22 down to the shallow trench isolation structure 12 that is located between AA1 and AA2.

The contact cut region 26 is formed by first forming a patterned hard mask layer 24 on top of the exemplary semiconductor structure shown in FIG. 3. The patterned hard mask layer 24 is composed of any hard mask material such as, for example, silicon dioxide and/or silicon nitride. The patterned hard mask layer 24 can be formed by deposition of the hard mask material, followed by lithographically patterning the as-deposited hard mask material. The patterned hard mask layer 24 has an opening formed therein that defines the area for contact cut region 26 formation. One or more etching processes (dry etching and/or chemical etching) can be used to transfer the pattern from the patterned hard mask layer 24 into the underlying semiconductor structure to provide the contact cut region 26. The contact cut region 26 splits the shared contact conductor metal 22 into a first S/D contact structure 22A and a second S/D contact structure 22B. The first S/D contact structure 22A is electrically connected to the first source/drain region 16 by the remaining portion of the first metal semiconductor alloy layer 20, and the second S/D contact structure 22B is electrically connected to the second source/drain region 17 by the remaining portion of the second metal semiconductor alloy layer 21.

During the etch, the inward facing tip of the first source/drain region 16 and the inward facing tip of the second source/drain region 17 can be removed as is shown in FIG. 4. The removal of the inward facing tips of the first source/drain region 16 and the second source/drain region 17 lessens the risk of tip-to-tip shorting between the first source/drain region 16 and the second source/drain region 17 in the area between AA1 and AAA2. The inward facing sidewall of the first source/drain region 16 and the inward facing sidewall of the second source/drain region 17 are both bare after contact cut region 26 formation. After contact cut region 26 formation, the first source/drain region 16 and the second source/drain region 17 are both asymmetrically shaped. Notably, the asymmetrical shaped first source/drain region 16 has a tip located on one side and on the other side the asymmetrical shaped first source/drain region 16 (within the contact cut region 26) has a sidewall that is substantially perpendicular (i.e., within ±10%) to a horizontal surface of the semiconductor substrate 10. The asymmetrical shaped second source/drain region 17 has a tip located on one side and on the other side the asymmetrical shaped second source/drain region 17 (within the contact cut region 26) has a sidewall that is substantially perpendicular (i.e., within ±10%) to a horizontal surface of the semiconductor substrate 10. The tip of the asymmetrical shaped first source/drain region 16 faces away from the tip of the asymmetrical shaped second source/drain region 17, while the sidewalls of the sidewalls of the asymmetrical shaped first source/drain region 16 and the asymmetrical shaped second source/drain region 17 face each other and are within the contact cut region 26 as is shown in FIG. 4.

In some embodiments, the etch can cut into (i.e., recess) the shallow trench isolation structure 12 that is located between AA1 and AA2 and form a recessed region in the shallow trench isolation structure 12 that is located between AA1 and AA2.

Referring now to FIG. 5, there is illustrated the exemplary semiconductor structure shown in FIG. 4 after additional metal semiconductor alloy layer formation on physically exposed surfaces (i.e., inward facing and bare sidewalls) of the first source/drain region 16 and the second source/drain region 17 in the contact cut region 26. Notably, the additional metal semiconductor alloy layer together with the first metal semiconductor alloy layer 20 forms a first metal semiconductor alloy liner 20L on the first source/drain region 16 and the additional metal semiconductor alloy layer together with the second metal semiconductor alloy layer 21 forms a second metal semiconductor alloy liner 21L on the second source/drain region 17. The additional metal semiconductor alloy layer formation includes materials and techniques mentioned above in forming the first metal semiconductor alloy layer 20 and the second semiconductor material layer 21. The metal semiconductor alloy forming metal used in forming the additional metal semiconductor alloy layer is typically the same as used above in forming the first metal semiconductor alloy layer 20 and the second metal semiconductor alloy layer 21.

The first metal semiconductor alloy liner 20L and the second metal semiconductor alloy liner 21L are both asymmetrical liners that wrap around their respective source/drain region. The first metal semiconductor alloy liner 20L and the second metal semiconductor alloy liner 21L can be referred to as wrap-around contact liners. The term "asymmetrical liner" denotes a liner having a length that is located on one side of the respective source/drain region that is longer than on the other side of the respective source/drain region. In the present application, the longer length of the asymmetric liner is located on the side of the respective source/drain region that has been cut during contact cut region 26. That is, longer length of the asymmetric liner is located on inward facing sidewall of the respective source/drain region.

Referring now to FIG. 6, there is illustrated the exemplary semiconductor structure shown in FIG. 5 after selective deposition of a conductive material liner 28 in the contact cut region 26. The conductive material liner 28 is composed of any metal liner material such as, for example, W, Co, Ru, or Nb. The conductive material liner 28 is selectively deposited by a selective metal growth process only on metal, not on any dielectric material or semiconductor material. That is, on one side of the contact cut region 26 the conductive material liner 28 is formed on the first metal semiconductor alloy liner 20L and the first S/D contact structure 22A and on a second side of the contact cut region 26 the conductive material liner 28 is formed on the second metal semiconductor alloy liner 21L and the second S/D contact structure 22B. In embodiments of the present application, the conductive metal liner 28 has a topmost surface that is coplanar with a topmost surface of each of the first S/D contact structure 22A and the second S/D contact structure 22B.

Referring now to FIG. 7, there is illustrated the exemplary semiconductor structure shown in FIG. 6 after filling a remaining volume of the contact cut region 26 with a contact cut dielectric material to form a dielectric pillar 30. The cut dielectric material that provides the dielectric pillar 30 is typically compositionally different from the MOL dielectric layer 18. Exemplary contact cut dielectric materials that can be used in providing the dielectric pillar 30 include SiC or SiOC. The dielectric pillar 30 can be formed by depositing the contact cut dielectric material, followed by a planarization process such as, for example, CMP. The dielectric pillar 30 has a bottommost surface that directly contacts the shallow trench isolation structure 12 that is located between AA1 and AA2. The dielectric pillar 30 typically has a topmost surface that is coplanar with a topmost surface of each of the conductive metal liner 28, the first S/D contact structure 22A and the second S/D contact structure 22B. During the planarization process, the patterned hard mask 26 is removed from the structure. The dielectric pillar 30 can be present beneath the bottommost surface of each of the conductive material liner 28, the first metal semiconductor alloy liner 20L and the second metal semiconductor alloy liner 21L.

Referring now to FIG. 8, there is illustrated the exemplary semiconductor structure shown in FIG. 7 after forming metal vias V0 and metal lines M1 to provide an exemplary semiconductor device in accordance with an embodiment of the present application. The metal vias V0 and the metal lines M1 are formed in an interlayer dielectric material (ILD) structure 32 that contains at least two ILD layers. A first ILD layer (not specifically labeled) of the ILD material structure 32 houses the metal via V0, while a second ILD layer (not specifically labeled) of the ILD material structure 32 houses the metal lines M1. As illustrated, one of the metal lines M1 is electrically connected to the first S/D contact structure 22A by one of the metal vias V0, while another of the metal lines M1 is electrically connected to the second S/D contact structure 22B by another of the metal vias V0.

The ILD material structure 32 is composed of one or more dielectric materials including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. Each ILD material layer that provides the ILD material structure 32 can be formed by a deposition process including, but not limited to, CVD, PECVD or spin-on coating.

Metal vias V0 and metal lines M1 are formed utilizing a metallization process. In the present application, a lower portion of the ILD material structure 32 is formed, and then the metal vias V0 are formed utilizing a first metallization process. An upper portion of the ILD material structure 32 is then formed and thereafter metal lines M1 can be formed utilizing a second metallization process. Each of the first and second metallization processes include forming openings within the one of the ILD layers of the ILD material structure 32 and thereafter filling (including deposition and planarization) each the opening with at least a contact conductor material. The contact conductor material that can be used for providing the metal vias V0 and metal lines M1 include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. V0 and M1 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

Referring now to FIG. 9, there is illustrated another exemplary semiconductor device in accordance with the present application. The exemplary semiconductor device shown in FIG. 9 is similar to the exemplary semiconductor device shown in FIG. 8 except that a void 31 is formed at the bottom of the dielectric pillar 30. Void 31 is formed due to the constraints (i.e., aspect ratio) of the contact cut region 26 which causes pinch-off of the contact cut dielectric material during deposition of the same at the bottom of the contact cut region 26. Void 31 can be an air-gap.

Referring now to FIG. 10, there is illustrated a yet other exemplary semiconductor device in accordance with the present application. The exemplary semiconductor device shown in FIG. 9 is similar to the exemplary semiconductor device shown in FIG. 8 except that dielectric pillar 30A and metal conductive liner 28A are formed on a side of the first source/drain region 16 that is opposite the side in which the contact cut region 26 was formed, and dielectric pillar 30B and metal conductive liner 28B are formed on a side of the second source/drain region 17 that is opposite the side in which the contact cut region 26. Here, the dielectric pillar 30A has a sidewall that can contact the MOL dielectric layer 18, and dielectric pillar 30B has a sidewall that can contact the MOL dielectric layer 18. In such an embodiment, the first S/D contact structure 22A and the first metal semiconductor alloy liner 20L are bounded on both sides by a metal conductive liner 28A, 28 and a dielectric pillar 30A, 30, and the second S/D contact structure 22B and the second metal semiconductor alloy liner 21L are bounded on both sides by a metal conductive liner 28B, 28 and a dielectric pillar 30B, 30. In this embodiment, the other side of both the first source/drain region 16 and the second source/drain region 17 opposite the side including the contact cut region 26 is cut to remove the tip to tip variation of source/drain regions of the same conductivity type transistors. In this embodiment, the first metal semiconductor alloy liner 20L and the second metal semiconductor alloy liner 20L are both symmetrical (wrap-around) liners having a same length on each side of the respective source/drain region. In this embodiment, the first source/drain region 16 and the second source/drain region 17 are both symmetrically shaped source/drain regions with no tip located on either side of the respective source/drain region.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:

a dielectric pillar located in a contact cut region that is positioned between a first source/drain region of a first transistor and a second source/drain region of a second transistor, wherein the dielectric pillar is in direct physical contact with a shallow trench isolation structure;

a first source/drain (S/D) contact structure located on a first side of the dielectric pillar and electrically connected to the first source/drain region;

a second S/D contact structure located on a second side of the dielectric pillar and electrically connected to the second source/drain region;

a first metal semiconductor alloy liner continuously wrapping around the first source/drain region;

a second metal semiconductor alloy liner continuously wrapping around the second source/drain region; and a metal conductive liner located on the first side of the dielectric pillar and on the second side of the dielectric pillar, wherein the metal conductive liner located on the first side of the dielectric pillar forms an interface with the first S/D contact structure and the first metal semiconductor alloy liner, and the metal conductive liner located on the second side of the dielectric pillar forms an interface with the second S/D contact structure and the second metal semiconductor alloy liner, wherein a bottommost surface of each of the metal conductive liner, the first metal semiconductor alloy liner and the second metal semiconductor alloy liner is spaced apart from the shallow trench isolation structure.

2. The semiconductor device of claim 1, wherein the first metal semiconductor alloy liner and the second metal semiconductor alloy liner are both asymmetric liners having a length in the contact cut region that is larger than a length that is present on a side of the first source/drain region and the second source/drain region that is opposite the contact cut region.

3. The semiconductor device of claim 2, wherein the first source/drain region and the second source/drain region are both asymmetrically shaped source/drain regions having a tip located on a side opposite the contact cut region and a sidewall in the contact cut region that is substantially perpendicular to a horizontal surface of a semiconductor substrate that is located beneath the first transistor and the second transistor.

4. The semiconductor device of claim 1, wherein the first metal semiconductor alloy liner and the second metal semiconductor alloy liner are both symmetric liners.

5. The semiconductor device of claim 4, wherein the first source/drain region and the second source/drain region are both symmetrically shaped source/drain regions having no tips on either side of the first source/drain region and the second source/drain region.

6. The semiconductor device of claim 5, further comprising an additional metal conductive liner and an additional dielectric pillar located on a side of the first source/drain region and the second source/drain region that is opposite the contact cut region.

7. The semiconductor device of claim 1, further comprising a void at a bottom of the dielectric pillar that is located in the contact cut region.

8. The semiconductor device of claim 1, further comprising a first metal line electrically connected to the first S/D contact structure by a first metal via, and a second metal line electrically connected to the second S/D contact structure by a second metal via.

9. The semiconductor device of claim 1, wherein the shallow trench isolation structure separates a first active area containing the first transistor from a second active area containing the second transistor.

10. The semiconductor device of claim 9, wherein the dielectric pillar has a topmost surface that is coplanar with a topmost surface of each of the first S/D contact structure, the second S/D contact structure and the metal conductive liner.

11. The semiconductor device of claim 1, wherein the dielectric pillar extends directly beneath and is direct contact with the bottommost surface of each of the first metal semiconductor alloy liner, the second metal semiconductor alloy liner and the metal conductive liner.

12. The semiconductor device of claim 1, wherein the first metal semiconductor alloy liner and the second metal semiconductor alloy liner are both composed of a metal silicide.

13. The semiconductor device of claim 1, wherein the first metal semiconductor alloy liner and the second metal semiconductor alloy liner are both composed of a metal germanide.

14. The semiconductor device of claim 1, further comprising a middle-of-the-line (MOL) dielectric layer adjacent to the first source/drain region and the second source/drain region.

15. The semiconductor device of claim 14, wherein the MOL dielectric layer embeds the first metal semiconductor alloy liner, the first S/D contact structure, the second metal semiconductor alloy liner and the second S/D contact structure.

16. The semiconductor device of claim 1, wherein the first transistor and the second transistor are both nanosheet field effect transistors (FETs).

17. The semiconductor device of claim 16, wherein the first transistor comprises a plurality of vertically stacked first semiconductor channel material nanosheets and the second transistor comprising a plurality of vertically stacked second semiconductor channel material nanosheets.

18. The semiconductor device of claim 1, wherein the first transistor and the second transistor are both finFETs.

19. A method of forming a semiconductor device, the method comprising:

forming a semiconductor structure comprising a first source/drain region of a first transistor located in a first active area, a second source/drain region of a second transistor located in a second active area and a MOL dielectric layer located above and adjacent to the first source/drain region and the second source/drain region;

forming a source/drain (S/D) trench metal contact structure including a metal semiconductor alloy layer located on each of the first source/drain region and the second source/drain region and a shared contact conductor metal;

cutting the S/D trench metal contact structure to form a contact cut region, wherein the cutting removes the metal semiconductor alloy layer from both the first source/drain region and the second source/drain region in the contact cut region and cuts the shared contact conductive metal into individual S/D contact structures;

forming additional metal semiconductor alloy layer on physically exposed surfaces of the first source/drain region and the second source/drain region in the contact cut region;

selectively depositing a conductive material liner in the contact cut region and along a sidewall of the additional metal semiconductor alloy layer; and filling a remaining volume of the contact cut region with a contact cut dielectric material, wherein the contact cut dielectric material extends beneath and is in contact with a bottommost surface of the additional metal semiconductor alloy layer and the conductive metal liner.

20. The method of claim 19, further comprising forming metal vias and metal lines above the MOL dielectric layer.

* * * * *